United States Patent [19]

Frankeny

[11] Patent Number: 5,680,342
[45] Date of Patent: Oct. 21, 1997

[54] MEMORY MODULE PACKAGE WITH ADDRESS BUS BUFFERING

[75] Inventor: Richard Francis Frankeny, Elgin, Tex.

[73] Assignee: International Business Machines Corporation, Armonk, N.Y.

[21] Appl. No.: 631,859

[22] Filed: Apr. 10, 1996

[51] Int. Cl.⁶ .................................................. G11C 5/06
[52] U.S. Cl. .................. 365/52; 365/51; 365/63; 365/230.03
[58] Field of Search .................. 365/52, 63, 51, 365/230.03

[56] References Cited

U.S. PATENT DOCUMENTS

| | | | |
|---|---|---|---|
| 4,426,689 | 1/1984 | Henle et al. | 365/52 |
| 4,754,316 | 6/1988 | Reid | 357/68 |
| 4,954,458 | 9/1990 | Reid | 437/51 |
| 5,229,916 | 7/1993 | Frankeny et al. | 361/386 |
| 5,244,395 | 9/1993 | DeSantis et al. | 439/65 |
| 5,260,892 | 11/1993 | Testa | 365/63 |
| 5,319,591 | 6/1994 | Takeda et al. | 365/52 |
| 5,426,566 | 6/1995 | Beilstein, Jr. et al. | 257/686 |
| 5,432,729 | 7/1995 | Carson et al. | 365/63 |

FOREIGN PATENT DOCUMENTS 2-17644  1/1990  Japan .

*Primary Examiner*—Son T. Dinh
*Attorney, Agent, or Firm*—Casimer K. Salys

[57] ABSTRACT

Systems and methods for connecting multiple memory modules to a computer system while controlling address bus and data bus loading and termination effects. In one form, the modules are connected to a printed circuit board carrying the address and data buses using dendrite enhanced bonds between module contacts and printed circuit board pads. The address bus loading which typically characterizes the addition of memory to a computer system is minimized through the inclusion of an address buffer module with each group of memory modules in a module expansion carrier. Data bus termination characteristics are controlled using jumpers within the modules. The invention is particularly suited for use with modules configured with chip edge interconnect technology, allowing the computer system user to expand the system memory without unduly effecting the address bus and data bus line characteristics.

13 Claims, 5 Drawing Sheets

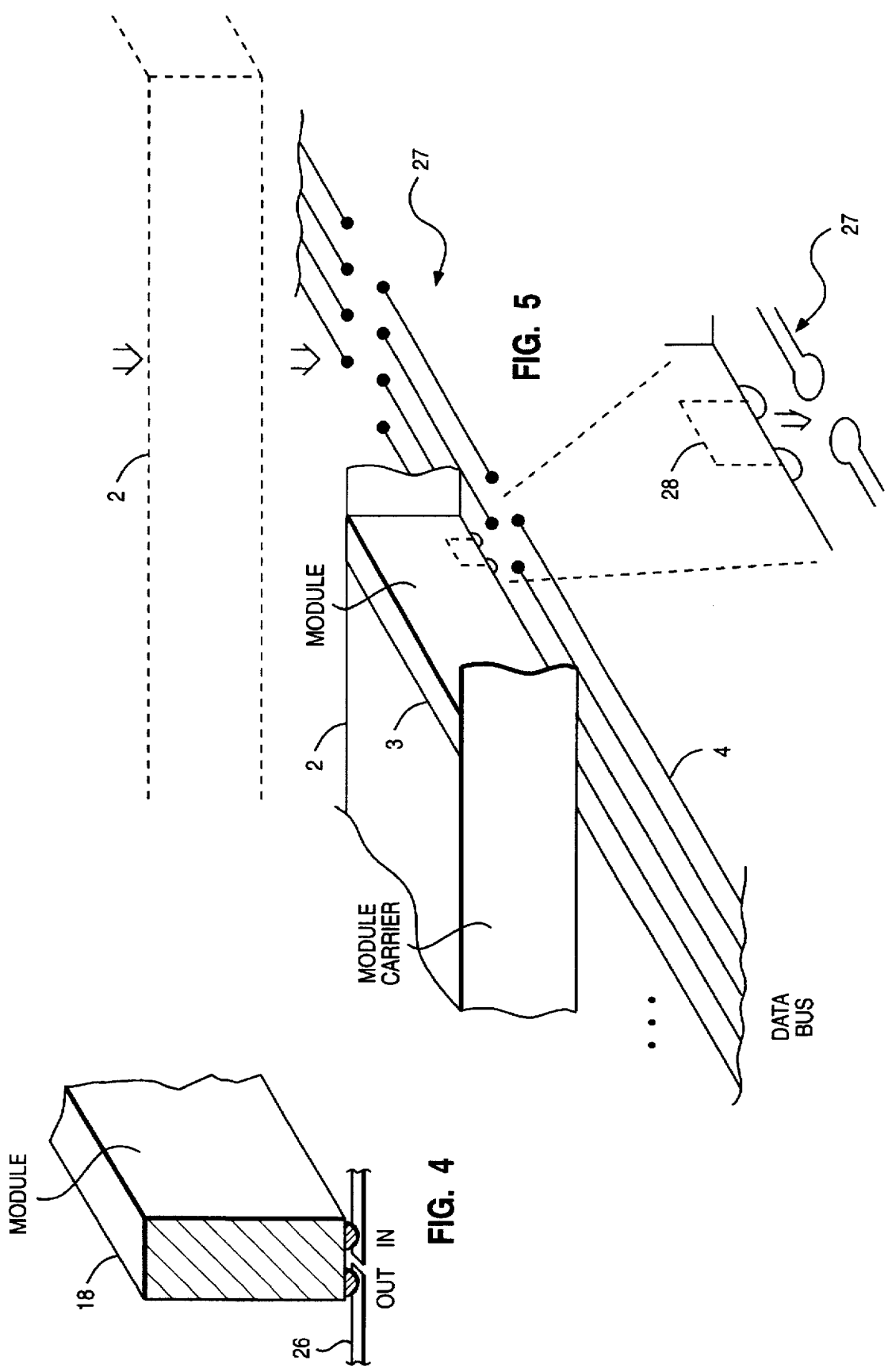

MEMORY MODULE PACKAGE WITH ADDRESS BUS BUFFERING

FIELD OF THE INVENTION

The present invention relates generally to packaging of electronic devices. More particularly, the invention is directed to a high density memory packaging architecture refined to efficiently buffer the signals on the lines of the address bus.

BACKGROUND OF THE INVENTION

Advances in personal computer or workstation data processing rates, graphics resolution and manipulation capabilities, operating system functions, and application software features has lead to significant increases in the sizes of the volatile memories employed with contemporary systems. Though designers of integrated circuit memory devices have made tremendous gains in shrinking the dimensions of dynamic random access memory (DRAM) chips, the board level mounting of such integrated circuit chips in systems which allow computer users to selectively reconfigure has lagged the other developments.

Contemporary personal computers and workstations memory arrays use SIMMs, composed of multiple packaged chips mounted on miniature printed circuit boards. More recent advances are described in U.S. Pat. No. 5,229,916. The technology in that patent relates to the use of a flexible polymer to interconnect chips and reorient the wiring patterns for direct printed circuit board connection. Refinements of that technology are described in copending U.S. patent application Ser. No. 08/573,045 filed Dec. 15, 1995. The subject matter of both are incorporated herein by reference.

Though packaging and mounting technology refinements increase the densities of memory arrays, they do introduce other, functional, problems. A particular problem, to which this invention is directed, relates to the effects of changing configurations on the drive devices which provide address signals to the memory. The memory array architecture and address drive structure must allow user implemented memory size variations without unduly affecting system level operation.

The driving of the address bus in contemporary personal computer workstation designs is accomplished by integrated circuit devices which are sized for worst case load and line termination conditions. The address driver devices are therefore unnecessarily large when users configure the memory at the lower end of the size range, yet are stressed to the ultimate if the full size capability of the memory is being utilized. As the potential needs of personal computer and workstation memory systems increase, the memory sizes are also expected to increase in range.

Each address line must connect to each chip in the memory array for a typical memory configuration. As a general rule, the addition of a memory chip or module to a memory array increases the data bus load by a unit of one, while increasing the load on each address bus line by the number of chips or modules in the whole memory array. For that reason, the high frequency transmission line impedance implications of memory size changes are significantly more pronounced on the address bus, in comparison to the effects on the data bus, of a conventional memory array.

Therefore, there has arisen a need for a system and method of operation by which the effects of load variations on the address bus lines can be managed while providing a full capability for personal computer or workstation users to increase or decrease the size of the memory array.

SUMMARY OF THE INVENTION

The problems characterizing the existing technology are solved according to the present invention in the context of a processor memory array having multiple modules, a multiple line data bus, and a multiple line address bus, through an address signal buffer system comprising, means for distributing address signals over address lines common to a first set of multiple memory modules, means for distributing address signals to address lines common to a second set of multiple memory modules, a buffer module connected to receive address signals from the address lines common to the first set of multiple memory modules and distribute buffered address signals to the address lines confusion to the second set of multiple memory modules, and means for mounting the buffer module and multiple memory modules in a common memory array carrier.

In another form, the invention defines a solution through a method of interconnecting a processor memory array to provide buffered address signals to memory modules of the array, through the practice of steps comprised of forming on a printed circuit board address lines in a pattern having first and second segments, with a conductive break between the segments, attaching a first set of memory modules to the board so that address lines of the first set of memory modules are connected to respective address lines in the first segment of the pattern, attaching a second set of memory modules to the board so that address lines of the second set of memory modules are connected to respective address lines in the second segment of the pattern, and attaching an address of buffer module to the board so that input lines of the address buffer module are connected to respective address lines in the first segment of the pattern and output lines of the address buffer module are connected to respective address lines in the second segment of the pattern.

In one implementation of the invention, the memory modules of the memory array are mounted in a multiple module carrier and have successively interspersed therebetween address buffer modules. The buffer modules conform to the carrier formed factor yet serve to buffer and retransmit the original address bus signals to associated groups of memory modules in the carrier. The modules are contemplated to be situated in a succession of adjacently located slots within the carrier, and to have each module connected directly through contacts in a lower edge to an underlying conductive interconnect pattern on a planar substrate, such as a printed circuit board.

The address line buffer modules are added to the array carrier at locations corresponding to breaks in the address bus conductive pattern. For each buffered line, the address signals received from one segment of the bus line are distributed after buffering to the next successive segment of the bus line pattern. The structural implementation of the memory array is particularly suited for dendrite interconnection, the dendrites being plated on at least one of the connecting surfaces. Highly repeatable and reliable connections are made when physical compression forces the dendrites on one contact surface into low melting point solder formed on a complimentary contact surface.

These and other features of the invention will be more clearly understood and appreciated upon considering the detailed description which follows hereinafter.

BRIEF DESCRIPTION OF THE DRAWINGS

FIG. 4 is a schematic cross-section of a module with multiple rows of dendrite based contacts.

FIG. 5 is a schematic diagram depicting the use of a module and related carrier to selectively couple in additional segments of data bus as the memory array increases in size.

DESCRIPTION OF THE PREFERRED EMBODIMENT

Figure 1:
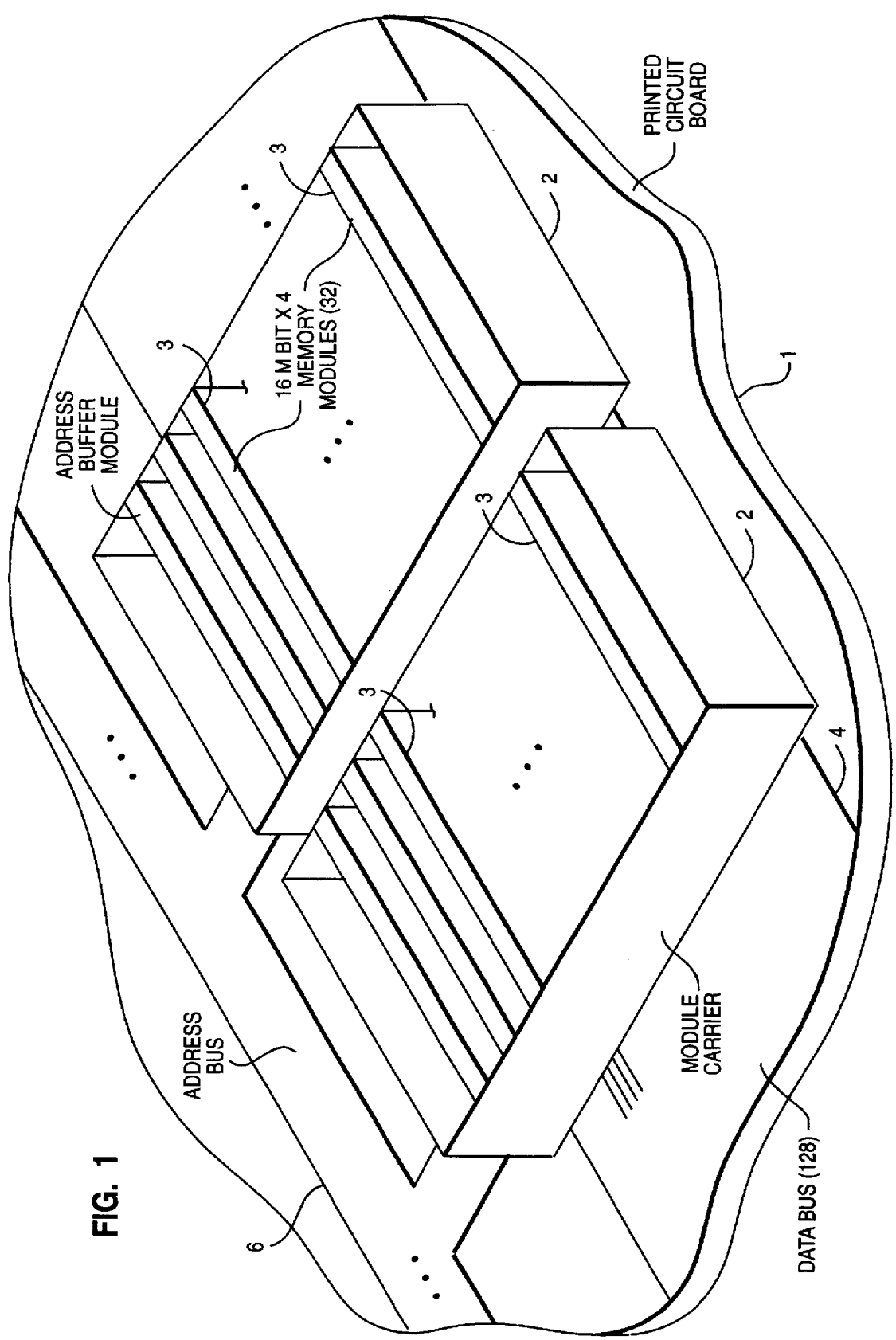
FIG. 1 is a schematic diagram of a printed circuit board memory array, including a plurality of modules sharing a common address bus.

FIG. 1 schematically depicts the context within which the present invention is preferably practiced. As shown, a personal computer or workstation printed circuit board 1 has mounted thereon multiple module carriers 2, where each module carrier 2 contains multiple memory modules 3. Memory modules 3 are preferably configured in the manner described in U.S. Pat. No. 5,229,916, as shown by schematic cross section in FIG. 2. Other configurations using multiple integrated circuit chips are also contemplated. Modules 3 are mounted in carriers 2 so that connections at the base of respective modules 3 ohmicly contact the respective lines of data bus 4 and address bus 6 to receive and transmit, as necessary, address and data signals in and out of the memory array defined by the memory devices in carriers 2.

For purposes of illustration, but not limitation, consider an embodiment in which data bus 4 is composed of 128 lines for simultaneously transmitting a quantity of four 32 bit long data words. In that context, each memory modules 3 is a 16 megabyte X4 module, with each module carrier 2 having a compliment of 32 memory modules 3. In that context, the problems which the present invention addresses are the effects of having a user add or delete modules 3, from the perspective of the termination and loading effects on address bus 6.

Figure 2:
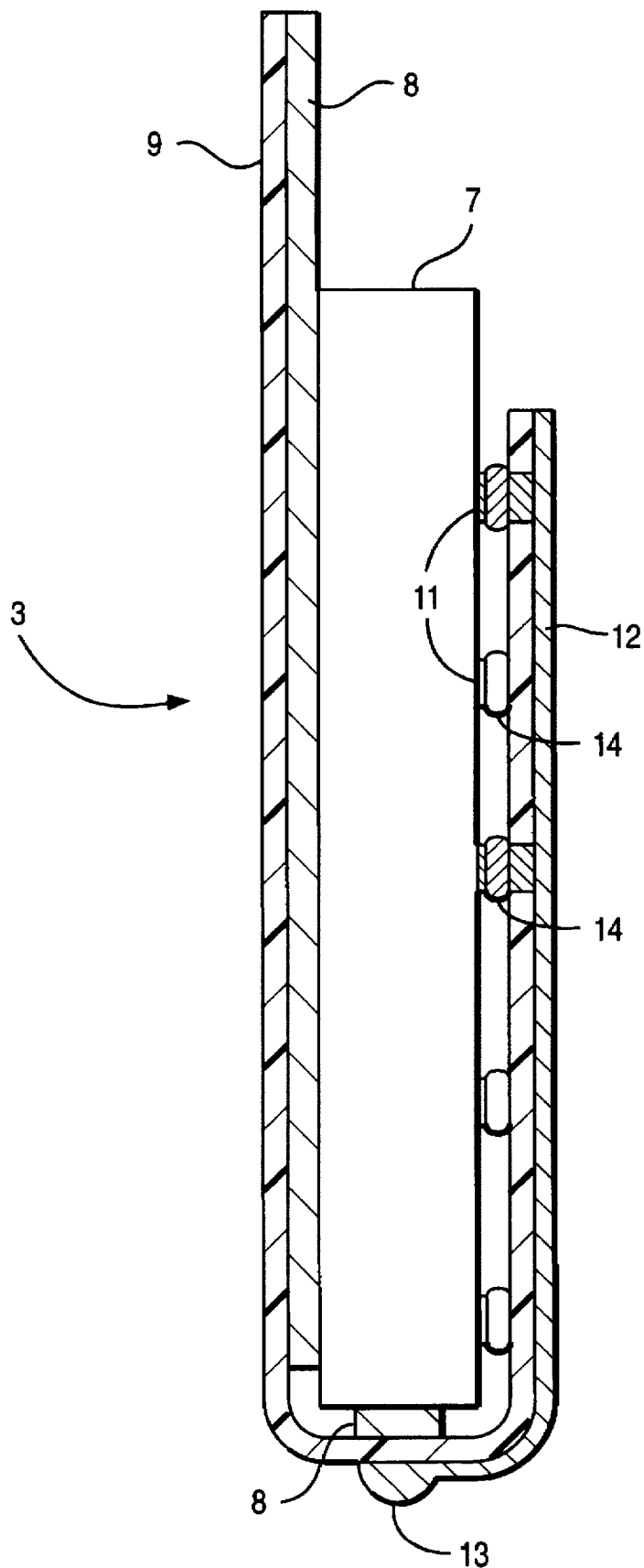
FIG. 2 is a schematic cross-section of a representative single integrated circuit chip module.

For purpose of clarity, FIG. 2 shows by schematic cross section a representative structure for module 3, in keeping with the teachings in U.S. Pat. No. 5,229,916. The module is structured around the integrated circuit chip or die 7, using thermally conductive metal or the like 8 at the back and edge of die 7, and a flexible polymer 9 extending around chip 7 to make connections between pads 11 formed on the surface of chip 7 and a wiring pattern 12 formed on polymer 9. The objective is to reorient the connections from the surface of chip 7 to the edge plane as defined by module contacts 13. The connections between pads 11 of chip 7 and contacts 14 formed on polymer 9 are preferably accomplished by plating one surface with dendrites as taught in U.S. Pat. No. 5,137,461, the subject matter of which is incorporated herein by reference, and compressively forcing those dendrites into a low melting point solder deposited on opposing contact surfaces.

The use of dendrite plating and compressive connection is also practiced in making the connection between contact 13 and the wiring patterns formed on printed circuit board 1 (FIG. 1) which define data bus 4 and address bus 6. Again, one contact surface is plated with dendrites, the opposing contact surface is covered with low temperature solder, and the two contact surfaces are bonded using the penetration and mechanical attachment capabilities of the dendrites.

Further refinements of that fundamental concept are described in U.S. patent application Ser. No. 08/583,045, filed Dec. 15, 1995, the subject matter of which is incorporated herein by reference.

Figure 3:
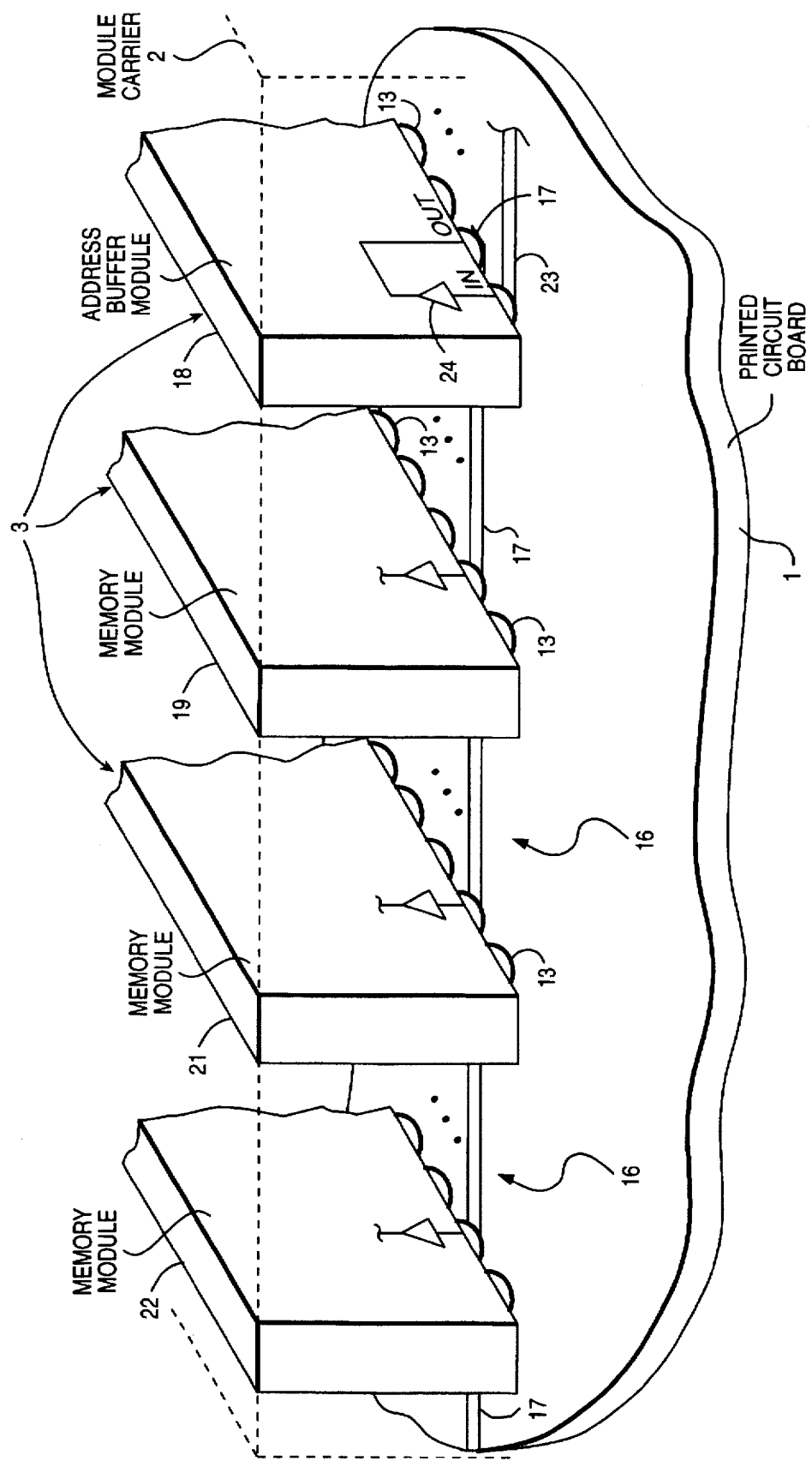
FIG. 3 is a schematic diagram depicting an embodying interconnect pattern for a multiple memory module array, including an address bus buffer module situated along the address bus defined by a printed circuit board conductive pattern.
Figure 6:
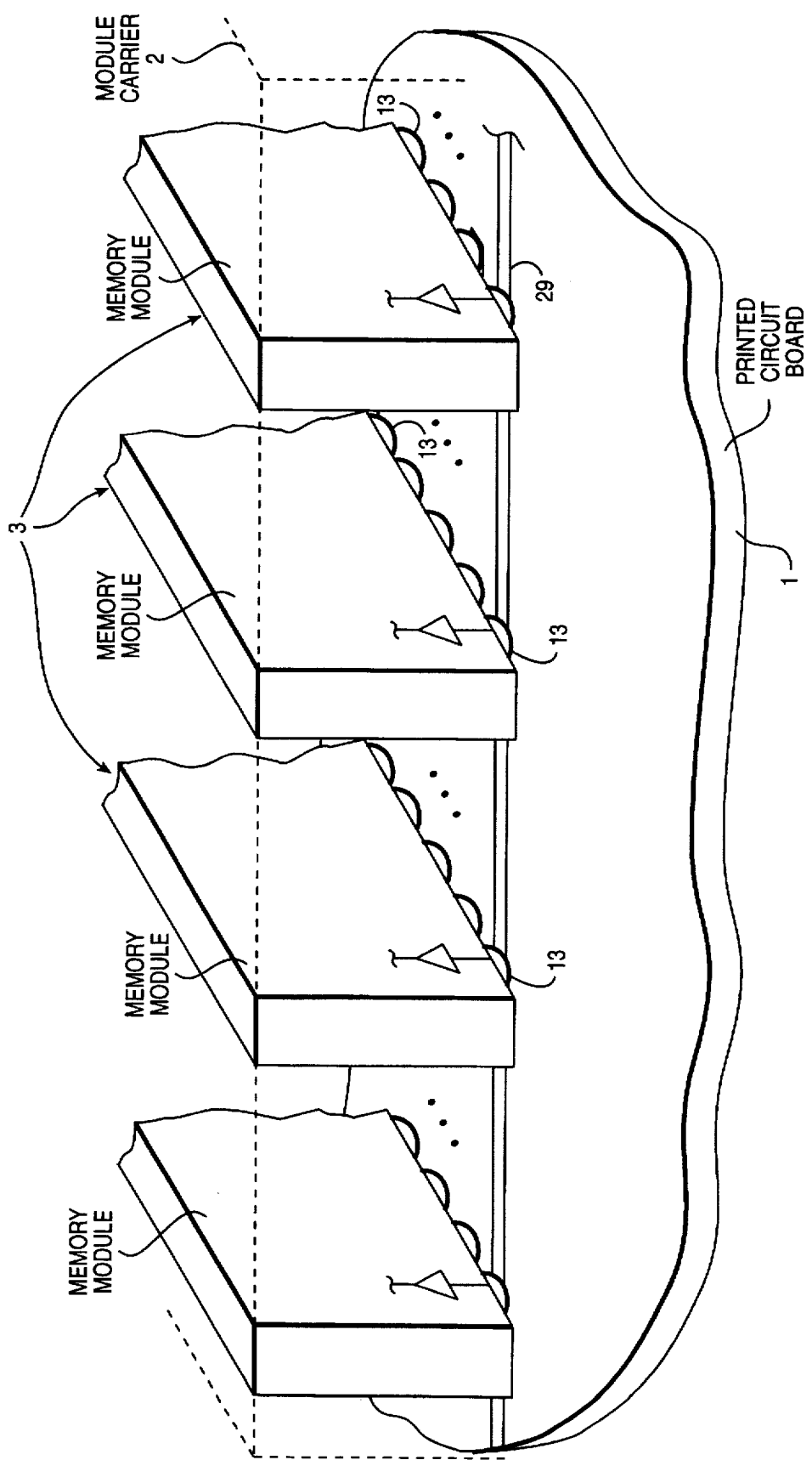
FIG. 6 is a schematic diagram depicting a multiple module array without an address bus buffer module.

The particulars of a preferred structure and practice for connecting modules 3 to printed circuit board 1 are depicted schematically in FIG. 3. Printed circuit board 1 is shown to have an electrically conductive, typically plated copper, interconnect pattern 16 formed on the surface opposing modules 3. The embodied interconnect pattern 16 includes a run 17, which extends from beneath address buffer module 18, under the succession of memory modules 19, 21 and 22, as well as run 23, which terminates at address buffer module 18. Electrical connection between contacts 13 of the various modules 3 and the wiring interconnect pattern 16 on printed circuit board 1 is preferably accomplished using plated dendrites and solder in the manner described hereinbefore.

The fundamental objective of the invention as set forth herein is to provide a system architecture and method by which a user can readily alter the memory size of a personal computer or workstation while minimally effecting the loading and termination, and accordingly the signal characteristics, of the address bus. In that context, the embodiment in FIG. 3 contemplates the inclusion of an address buffer module 18 for a corresponding plurality of memory modules 19, 21 and 22 along the address bus. Accordingly, line 23 is a line from address bus 6 (FIG. 1). Address buffer module 18 receives the address signal from line 23, buffers the address signal using amplifier 24, and transmits the buffered address signal on line 17 to the inputs of the succession of memory modules connected to line 17. This implementation isolates the loading effects of multiple memory modules 19, 21 and 22 from address bus 6 while allowing a user of the personal computer or workstation to add or delete memory carriers, having associated multiple memory modules and address buffer modules, with minimal impact upon the address bus.

It should be apparent to one knowledgeable in the technology that wiring pattern 16 on printed circuit board 1 merely illustrates the underlying concept of using one or more address buffer modules in conjunction with module carriers to minimize address bus loading. Given that two address buffer module contacts are needed for each address line subject to buffering, the interconnect wiring 16 of board 1 is likely to be defined through the use of vias and buried contacts.

An alternate approach is depicted in FIG. 4, where address buffer module 18 is shown to have two contacts in direct alignment with the pattern of the address line 26. As such, the input address signals are received through one contact and the buffer output signal transmitted through the other contact while retaining the projected alignment of the bus lines. However, that concept requires tighter module contact and module-to-carrier tolerances if overall module dimensions are to remain consistent.

FIG. 5 schematically depicts a further refinement of the invention, wherein the dendritically enhanced connections made by the contacts on the modules are also used to control the line impedance characteristics of data bus 4. According to the embodiment, modules 3 of carrier 2 connect-in further stubs 27 of data bus 4 with the addition of each module carrier 2. Electrical jumper 28 in module 3 incrementally extends data bus 4 by the length of stub 27 as an aspect of introducing an additional module carrier 2.

FIG. 5 schematically depicts an array of memory modules without an address buffer module, whereby the address line 29 is common to a line of address bus 6 (FIG. 1). This configuration typifies a memory array at the low end of the size range, a level from which additional memory modules require address buffer modules.

The present invention provides a highly efficient structure and method for managing the addition or deletion of memory in the context of a computer system, while managing loading and line termination effects on both the address and data buses. The concepts practiced by the invention utilize relatively new technology refinements, namely, dendritic plating, dendrite initiated connection, and miniaturized chip level modules, to define an overall memory architecture which is highly amenable to user customization. The features are consistent with advanced high clock frequency, low power consumption computer systems which are sensitive to bus loading and termination changes.

Though the invention has been described and illustrated by way of specific embodiments, the systems and methods encompassed by the invention should be interpreted to be in keeping with the breadth of the claims set forth hereinafter.

I claim:

1. In a processor memory array having multiple modules, a multiple line data bus, and a multiple line address bus, an address signal buffer system, comprising:

means for distributing address signals over address lines common to a first set of multiple memory modules;

means for distributing address signals to address lines common to a second set of multiple memory modules;

a buffer module connected to receive address signals from the address lines common to the first set of multiple memory modules and distribute buffered address signals to the address lines common to the second set of multiple memory modules; and means for mounting the buffer module and multiple memory modules in a common memory array carrier.

2. The apparatus recited in claim 1, wherein the address lines common to the first and second sets of multiple memory modules are wiring patterns on a printed circuit board onto which the memory array carrier is mounted.

3. The apparatus recited in claim 1, wherein the connection between the buffer modules and the address lines common to the first and second sets of multiple modules is through dendrites formed on at least one of a pair of surfaces mated for each connection.

4. The apparatus recited in claim 2, wherein the connection between the buffer modules and the address lines common to the first and second sets of multiple modules is through dendrites formed on at least one of a pair of surfaces mated for each connection.

5. The apparatus recited in claim 3, wherein contacts on the buffer module used to receive and distribute address signals are aligned with address line patterns defined by the first and second sets of multiple memory modules.

6. The apparatus recited in claim 4, wherein contacts on the buffer module used to receive and distribute address signals are aligned with address line patterns defined by the first and second sets of multiple memory modules.

7. The apparatus recited in claim 5, wherein the address signals distributed over the address lines include at least one line providing RAS/CAS strobe signals.

8. The apparatus recited in claim 6, wherein the address signals distributed over the address lines include at least one line providing RAS/CAS strobe signals.

9. The apparatus recited in claim 7, further comprising:

means in the modules for connecting in segments of the data bus lines to extend the data bus with an addition of a memory module.

10. The apparatus recited in claim 8, further comprising:

means in the modules for connecting segments of the data bus to extend the data bus lines with addition of a memory array carrier.

11. A method of interconnecting a processor memory array to provide buffered address signals to memory modules of the array, comprising the steps of:

forming on a printed circuit board address lines in a pattern having first and second segments, with a conductive break between the segments;

attaching a first set of memory modules to the board so that address lines of the first set of memory modules are connected to respective address lines in the first segment of the pattern;

attaching a second set of memory modules to the board so that address lines of the second set of memory modules are connected to respective address lines in the second segment of the pattern; and attaching an address buffer module to the board so that input lines of the address buffer module are connected to respective address lines in the first segment of the pattern and output lines of the address buffer module are connected to respective address lines in the second segment of the pattern.

12. The method recited in claim 11, wherein the connection between the modules and address lines of the pattern is made but by physical contact involving the use of dendrites formed on at least one of a pair of surfaces mated for connection.

13. The method recited in claim 12, wherein the first and second segments of the address line pattern are aligned.

* * * * *